United States Patent
Biedorf et al.

(10) Patent No.: US 6,902,100 B2
(45) Date of Patent: Jun. 7, 2005

(54) METHOD OF IMPROVING THE QUALITY OF SOLDERED CONNECTIONS

(75) Inventors: Rolf Biedorf, Dresden (DE); Roland Heinze, Neustadt/Sachsen (DE); Klaus-Juergen Wolter, Dresden (DE)

(73) Assignee: Infineon Technologies AG, Munich (DE)

( * ) Notice: Subject to any disclaimer, the term of this patent is extended or adjusted under 35 U.S.C. 154(b) by 19 days.

(21) Appl. No.: 10/350,373

(22) Filed: Jan. 23, 2003

(65) Prior Publication Data

US 2003/0168495 A1 Sep. 11, 2003

(30) Foreign Application Priority Data

Jan. 25, 2002 (DE) .......................................... 102 03 112

(51) Int. Cl.$^7$ .............................................. B23K 31/02
(52) U.S. Cl. ................. 228/180.22; 228/223; 228/248.1
(58) Field of Search .......................... 228/248.1, 180.1, 228/180.21, 180.22, 207, 223, 49.1, 49.5

(56) References Cited

U.S. PATENT DOCUMENTS

| | | | | |
|---|---|---|---|---|
| 6,418,033 B1 | * | 7/2002 | Rinne .......................... | 361/784 |
| 6,472,068 B1 | * | 10/2002 | Glass et al. .................. | 428/410 |
| 6,708,862 B2 | * | 3/2004 | Fujii et al. .................... | 228/6.2 |
| 2003/0168495 A1 | * | 9/2003 | Biedorf et al. ......... | 228/180.21 |

FOREIGN PATENT DOCUMENTS

| | | |
|---|---|---|
| JP | 63005867 | 1/1988 |
| JP | 04075772 | 3/1992 |
| JP | 10215063 | 8/1998 |
| JP | 11135929 | 5/1999 |

OTHER PUBLICATIONS

Translation of JP–10215063A.*

* cited by examiner

Primary Examiner—Kiley S. Stoner
(74) Attorney, Agent, or Firm—Baker Botts LLP

(57) ABSTRACT

The invention relates to a method for improving the quality of soldered connections between large-area SMD components and wiring carriers, in the case of which the parts to be joined are electrically and mechanically connected to one another by reflow soldering, a flux being used to activate the solder. The intention of the invention is to provide a method of improving the quality of soldered connections which is simple to realize and particularly effective and with which the number of voids can be drastically reduced. According to the invention, this is achieved by the parts to be joined being positioned one over the other and connected to each other by forming a force of adhesion and by the parts to be joined being arranged in such a way that they are tilted at a predetermined tilting angle with respect to the normal plane, at least during the melting of the solder paste. The tilting angle during the melting should lie between greater than 0° and less than 180° and preferably be about 90°.

12 Claims, 3 Drawing Sheets

METHOD OF IMPROVING THE QUALITY OF SOLDERED CONNECTIONS

BACKGROUND OF INVENTION

The invention relates to a method of improving the quality of soldered connections between large-area SMD components with contact pads on the underside and circuit boards or wiring carriers, in the case of which the solder required for connection is already provided on at least one of these parts to be joined, a flux is used to activate the solder, and the electrical and mechanical connection is established by a soldered connection by means of heat exposure and melting of the solder-flux mixture while the parts to be joined are transported through a soldering furnace, with a subsequent cooling phase.

Large-area SMD components, such as area-array components, are for example unpackaged semiconductor components (flip-chip components) or BGA (Ball-Grid-Array), BOC (Board-on-Chip) and CSP (Chip-Size-Packaging) components packaged in the smallest space by using wiring techniques, in the case of which the electrical terminals (pads) present on the underside are electrically connected to contacts on a printed circuit board with the aid of a soldered connection. To establish these soldered connections, usually solder is firstly applied to at least one of the parts to be joined and the component is subsequently positioned at the intended mounting location. The soldered connection is established after that by reflow soldering in a soldering furnace, a flux being required to activate the solder. This flux, usually comprising organic constituents, is either applied directly to one of the two parts to be joined, or is applied in the form of a solder paste as a mixture of small solder particles, usually with further organic additives (solvents and binders), to the location to be connected, for example by printing or dispensing. Printing of the solder paste allows either part or the entire amount of the solder required for establishing the connection, including the required flux, to be provided.

However, it must be stated that, when melting the solder paste in a customary reflow process, not all the organic constituents contained in the solder paste are used up for the chemical activation of the parts to be joined and the solder particles. The flux, solder and binder that remain in this case are distributed in and around the soldered connection during the soldering operation. The organic constituents still present within the soldered connection which is produced form bubbles filled with liquid or vapour during the soldering operation and, on account of their buoyancy, rise up into the upper regions of the soldered connection, since they are significantly lighter than the liquid metal surrounding them.

This has the consequence that, depending on the position of the subassembly, the bubbles impinge on the usually flat component terminals (pads), the surfaces of the underside of the component or the surface of the printed circuit board as it runs through the soldering furnace. By contrast with open soldered connections, the bubbles cannot escape from the soldered connection in their natural direction of movement. A lateral drift out of the soldered location is only possible to a greatly retarded extent, if at all. It has been found that many bubbles become lodged in the region under the soldered terminals and are entrapped in the solidified solder at the end of the soldering phase. The defects produced in the soldered contact in this way are known as "voids".

These voids disturb the electrical and mechanical function of the soldered connection if their number or size becomes too great in comparison with the amount of solder. A further disadvantage of these voids is that the organic constituents remaining in them have the effect over time of making the soldered connection come apart during the operation of the component as a result of thermal expansion. Harmful substances escaping or gathering in voids may lead to slow destruction of the subassembly caused by corrosion and lead to electrical short circuits caused by ions.

It has been found that a particularly large number of voids are formed under unfavourable conditions if, in addition to the flat component terminals, the soldered joint is also covered by the rest of the component. This is the case in particular with the area-array components used to an increasing extent, such as flip-chip, BGA, CoB or CSP components, in the case of which there are a particularly high number of soldered joints on the underside, distributed over the surface area. Here, the amount or concentration of the remains of the flux, solvent and binder contents of the soldered connection is particularly high in comparison with the amount of metal if too much solder or the entire solder required for the connection has been provided in the form of solder paste (mixture of approximately 50% by volume of organic constituents and 50% by volume of metal).

A particularly high number of voids are also formed if, on account of the further development of subassemblies, relatively small soldered connections have to be realized, but the size of the bubbles remains the same on the basis of the physical properties. In this case, the number and size of the voids in the soldered connections may reach critical ranges and can no longer be ignored, since they can then lead to reliability being restricted or render them completely useless.

To avoid such restrictions of the reliability and function of electrical components caused by voids, various tests have been carried out to research the causes of the voids and, finally, produce soldered connections that are free from voids.

In this respect, the following publications have become known:

W. Casey, Reduction of BGA Eutectic Ball Solder Joint Voiding, Proc. SMI '98 San Jose, 23–27 Aug. 1998; H. Bell, M. Kämpfert, Haken und Ösen bei der Verarbeitung von BGAs, Teil 1 und 2 [snags in the processing of BGAs, parts 1 and 2], SMT 2001 issue 3, pages 30–33 and issue 4, pages 12–17; N. C. Lee, Troubleshooting the Reflow soldering for SMT, BGA and Flip Chip Processes, Nepcon West 1998, Anaheim USA Calif.; M. Reichenberger, D. Kozic, H. Roth, Bleifrei geht's auch, Fehlstellen vermeiden in bleifreien BGA-Lötstellen [lead-free works too; avoid defects in lead-free BGA soldered joints], F & M Feinwerktechnik Microtechnik Microelektronik 19 (2001) 4.

Specified in these publications are various causes for the production of voids and their avoidance. For instance, changing the composition of the solder pastes by lowering the flux and solder content or increasing the metal content, or changing the viscosity of the organic constituents and the chemical composition of the solder pastes and also the grain size of the solder balls, is described. This achieves the effect that the volume and number of voids are reduced and the buoyancy or migration velocity is increased. As a result, however, there is a deterioration in the processing properties of the solder paste, such as the behaviour in screen printing and the wetting characteristics.

Another possibility is to change the nucleation for bubbles on the surfaces of the parts to be joined due to impurities, condensation water, moisture or surfaces with reactive regions or roughnesses. However, this requires additional cleaning operations, the avoidance of temperature fluctuations or the reduction of atmospheric humidity, and consequently leads to considerable additional effort.

The design of the parts to be joined may also be changed, by reducing the form and location of the ring of solder stop lacquer around the joint, in order to avoid a build-up of the bubbles escaping. Although this sometimes allows quite good results to be achieved, it does not produce an optimum design with respect to other properties of the subassembly.

Changing the melting profile has also been attempted, in order to give the bubbles the time to rise up and escape from the metal melt to the sides by raising the temperatures more slowly or more quickly and changing the peak temperature. However, the significantly increased thermal loading of the subassembly is disadvantageous in this case.

Finally, it has also been attempted to change the atmospheric conditions, by carrying out the soldering operation in a nitrogen atmosphere, in order to reduce the surface tension of the solder and consequently the work of emission. However, the formation of voids cannot be completely avoided in this way.

The main disadvantages of these methods are the increased effort, the deterioration in the quality of the subassembly and the inadequate avoidance of the occurrence of voids.

The invention is therefore based on the object of providing a method of improving the quality of soldered connections which is simple to realize and particularly effective and with which the number of voids can be drastically reduced.

SUMMARY OF THIS INVENTION

The object on which the invention is based is achieved in the case of a method of the type stated at the beginning by the parts to be joined being positioned one over the other and connected to each other by forming a force of adhesion and by the parts to be joined being arranged in such a way that they are tilted at a predetermined tilting angle with respect to the normal plane, at least during the melting of the solder paste.

The result of this unexpectedly simple method is that the number of voids is drastically reduced. All that is required for this purpose is to arrange the printed circuit board or the parts to be joined in such a way that they are tilted at an angle in relation to the normal plane of the transporting belt with which the parts to be joined are transported through the soldering furnace during the entire soldering operation or during a predetermined time. In this case, it is immaterial on which side of the printed circuit board or support element the components to be fastened, such as for example semiconductor chips, are located. During the tilting operation, the parts to be joined remain attached to one another by force of adhesion.

After the melting of the solder (the solder paste), the adhering properties are improved by the wetting forces of the molten solder on the pads of the printed circuit board or the component. The high force of adhesion, which keeps even relatively large components in the predetermined position during the entire soldering operation, is surprising.

By contrast with known solutions for avoiding voids, the method according to the invention allows soldered connections with far fewer voids or even entirely without voids to be produced. The disadvantages of the previously known methods of avoiding voids, such as for example prolonging or increasing the thermal loading of the parts to be joined during the reflow soldering, making the processing properties deteriorate and the additional cleaning effort in the process can be avoided in a surprisingly simple way.

In a refinement of the invention, the forming of the force of adhesion is improved by applying a slight force.

The tilting angle during melting must lie between 0° and 180°, a tilting angle of 90° being preferred, maximum success being obtainable in the vertical position. Tilting angles of 20°, 45° and 60° likewise yield an improvement, albeit smaller.

In a continuation of the invention, the tilting angle is changed during melting, a continuous change being preferred, in order to prevent movement of the parts to be joined caused by vibrations.

In a further refinement of the invention it is provided that the maximum intended tilting angle is reached after completion of the melting operation or in the peak zone.

One particular refinement of the invention is wherein the parts to be joined are repeatedly transported through a soldering furnace.

To achieve the effect that the bubbles leave the melted solder particularly quickly or completely, the parts to be joined may be subjected to vibrational loading during the melting operation. Such vibrational loading may take place by infrasound or ultrasound.

One particular refinement of the invention is wherein the tilting of the parts to be joined during the melting takes place by a continuous change, in order to prevent movement of the parts to be joined caused by vibrations.

A further possibility is to introduce a conditioning time with an essentially constant temperature between the melting operation and the following cooling phase.

The invention is to be explained in more detail below using exemplary embodiments.

DESCRIPTION OF THE INVENTION

Figure 1:
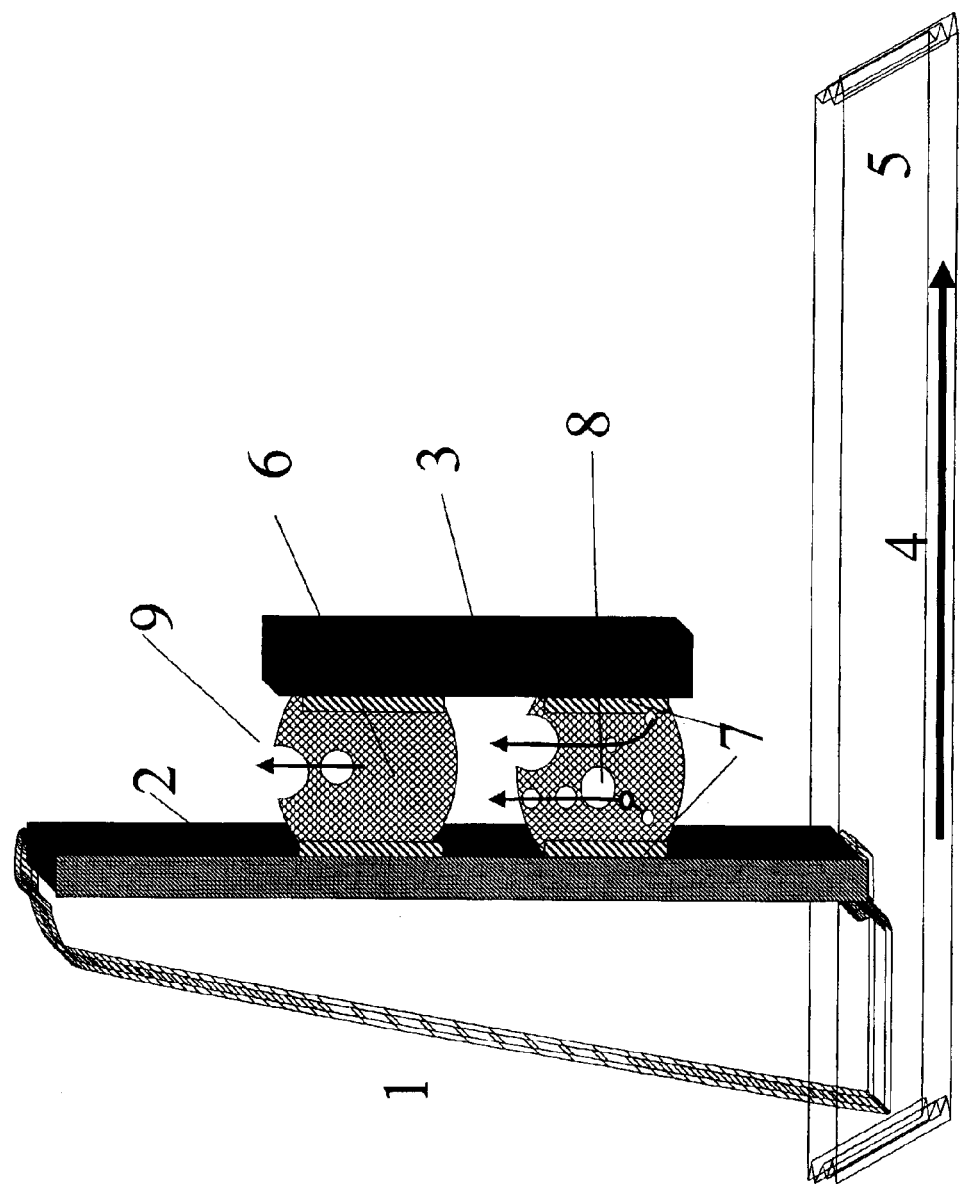
FIG. 1 shows the method according to the invention, in which the parts to be joined are transported in a vertical position through the soldering furnace and soldered to one another.

FIG. 1 shows how the printed circuit board 2, placed vertically in a holder 1, is transported with the component 3 arranged on it in the transporting direction 4 on a transporting belt 5 through a reflow furnace. The bubbles produced during the soldering process in the solder bump 6, which forms from the solder paste by melting of the tin-lead particles of the solder paste between the pads 7 of the printed circuit board 2 and the component 3, are driven by the natural buoyancy 9 to the surface of the liquid solder, where they escape into the surroundings.

Figure 2:
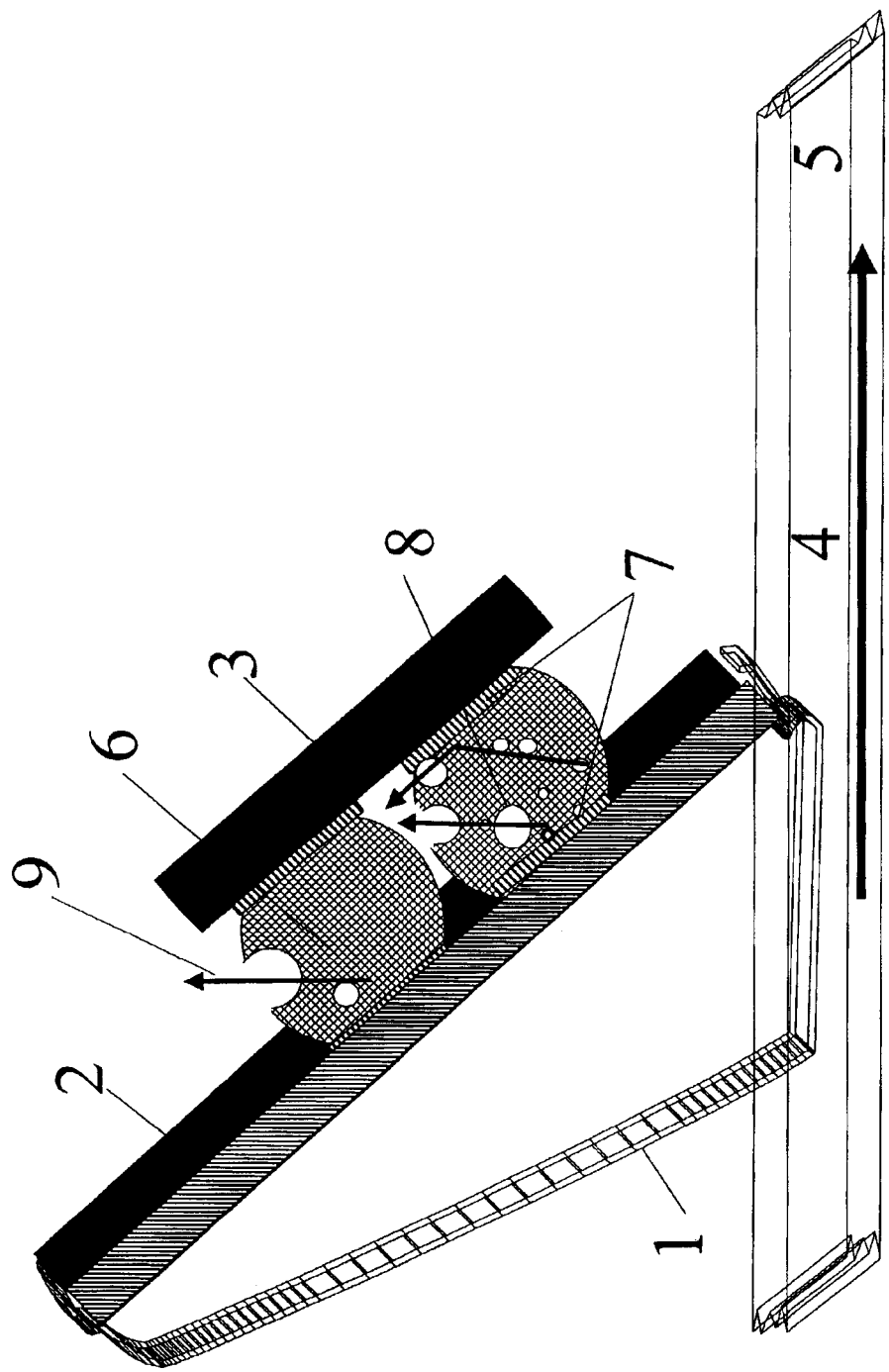
FIG. 2 shows the soldering of the parts to be joined at a setting angle of 45°.

In contrast to FIG. 1, FIG. 2 shows the arrangement of the printed circuit board 2 at an inclination of 45° with respect to the normal of the transporting belt 5.

Figure 3:
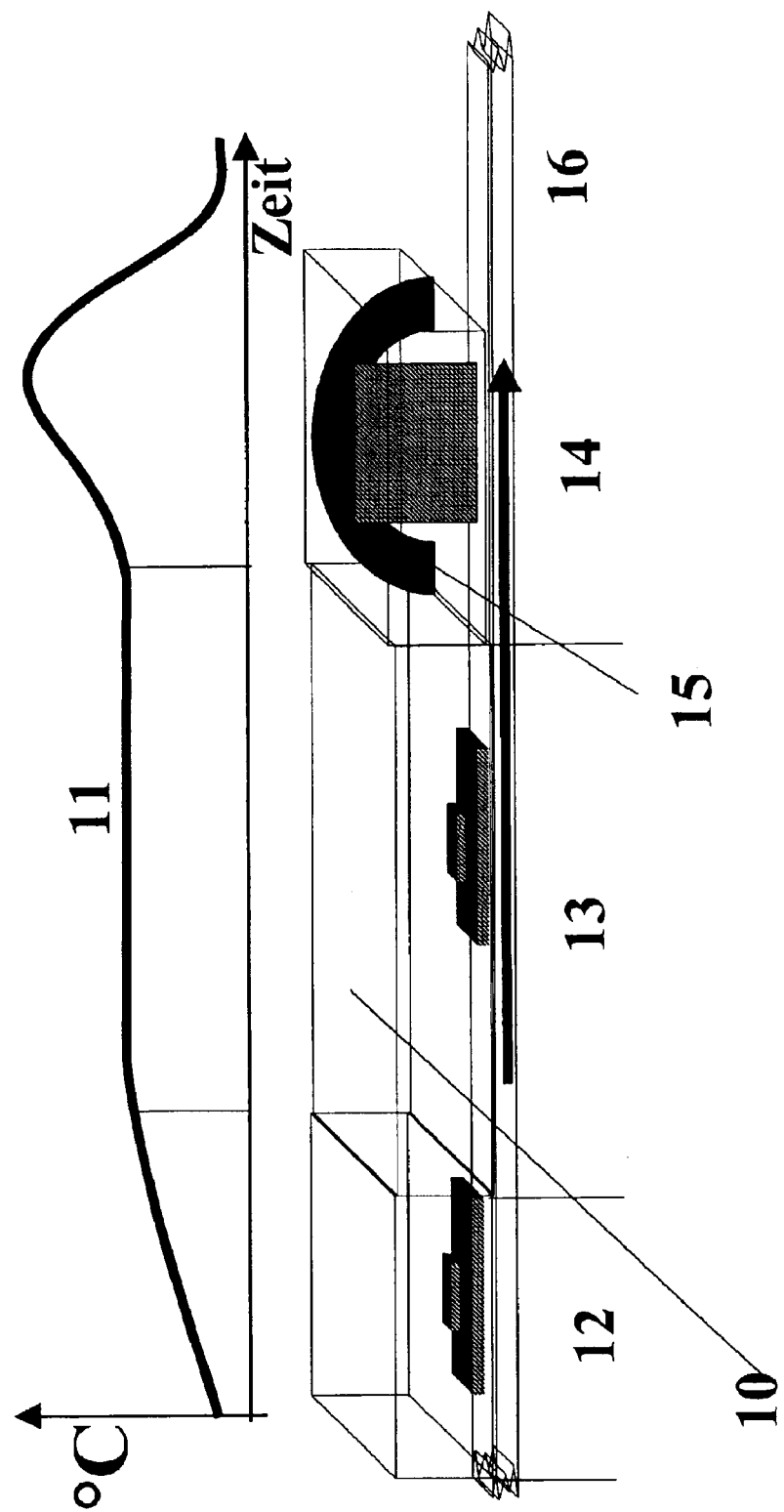
FIG. 3 shows the transporting of the parts to be joined through a reflow furnace with a temperature profile in a soldering curve.

Shown in FIG. 3 is the transporting of printed circuit boards 2 through a reflow furnace 10, the temperature profile of which during the soldering operation is represented in a soldering curve 11. In the pre-heating zone 12 of the reflow furnace and the saddle zone 13, the printed circuit board 2 lies horizontally. When it enters the peak zone 14, the printed circuit board 2 is set at a predetermined angle by means of a suitable device 15 for tilting the subassembly with respect to the plane of the transporting belt 5. This angle may be up to 90°. In this zone, the melting of the solder takes place and the bubbles produced can leave the solder bump 6 that is forming, in the way corresponding to FIG. 1. This operation can be accelerated, or at least intensified, by applying infrasound and/or ultrasound. However, in this case it must be ensured that the frequency of the infrasound or ultrasound is chosen outside the resonant frequency of the parts to be joined or the subassembly, in order to ensure with certainty that positioning problems are ruled out.

In the following cooling zone 16, the printed circuit board 2 is brought back into the horizontal position and leaves the reflow furnace.

EXAMPLE 1

Soldering in the vertical position of the subassembly (printed circuit board 2) with respect to the normal plane of the soldering furnace. Here, the printed circuit board 2 is positioned together with the components 3 placed onto the solder paste (solder bump 6) in a frame, which protects the parts to be soldered from tipping over, vertically onto the transporting belt 5 of the convection or soldering furnace. In this position, the printed circuit board 2 is subjected to the customary soldering process. As this takes place, the components 3 (CSP or micro-BGA components) are held by the adhesion on the, for example printed-on, solder paste on the vertical surface of the printed circuit board 2.

In an X-ray examination of the soldered component, it was found that there were no longer any voids.

EXAMPLE 2

The soldering was performed here with a smaller setting angle. Here, an oblique position of the printed circuit board 2 during the entire reflow process in the convection furnace (setting angle 45°) was achieved by the printed circuit board 2 being supported on one side on the transporting belt 5. In this case, the number of connections with voids was reduced to about 25% and the overall volume of the voids per soldered connection was also visibly reduced. The remaining voids are located at the edge of the soldered connection and are therefore no longer problematical.

EXAMPLE 3

Here, re-melting of the subassembly was performed after it had already been soldered in the customary way and contained voids in each soldered connection. Here, the subassembly was positioned vertically (standing upright) onto the transporting belt 5 and once again taken through the convection furnace (reflow furnace 10) and melted once again under the same conditions. The number of soldered connections with voids was reduced to 30%, the number and size of the voids still present in the soldered connections was visibly smaller.

We claim:

1. In a method for making soldered bump connections between large-area SMD components with contact pads on the underside and circuit boards or wiring carriers, wherein solder required for bump connection is provided on at least one part of a pair of substantially parallel parts to be joined, a flux is used to activate the solder, and an electrical and mechanical connection is established by exposure to heat and melting of the solder-flux mixture while the pair of substantially parallel parts to be joined are transported through a soldering furnace, with a subsequent cooling phase, the improvement comprising the step of positioning the parts to be joined one over the other and forming a force of adhesion to hold the parts together; and the step of tilting the pair of adhering parts together at a predetermined tilting angle with respect to horizontal, at least during the melting of the solder-flux mixture, so that buoyant gas bubbles in solder-flux mixture bumps exit through the edge surfaces of the bumps and escape through the space between the substantially parallel parts, whereby bubble-free solder bump connections are formed between the two parts.

2. The improvement specified in claim 1, wherein adhesion is improved by applying a slight force.

3. The improvement specified in claim 1, wherein the tilting angle during the melting is greater than 0 and less than or equal to 90.

4. The improvement specified in claim 3, wherein the tilting angle is about 90.

5. The improvement specified in claim 3 or 4, wherein the tilting angle is changed during melting.

6. The improvement specified in claim 5, wherein the tilting angle is continuously changed.

7. The improvement specified in claim 5, wherein the maximum tilting angle is reached after completion of the melting operation.

8. The improvement specified in one of claim 1, wherein the parts to be joined are repeatedly transported through a soldering furnace.

9. The improvement specified in claim 1, wherein the parts to be joined are subjected to vibrational loading during the melting operation.

10. The improvement specified in claim 9, wherein the vibrational loading takes place by ultrasound or infrasound energy outside the resonant frequency of the parts to be joined.

11. The improvement specified in claim 1, wherein the tilting of the parts to be joined is performed after reaching the peak zone or after the melting of the solder paste.

12. The improvement specified in claim 1, wherein a conditioning time with an essentially constant temperature is provided after the melting operation and before the cooling phase.

* * * * *